United States Patent
Hu

(10) Patent No.: US 9,806,044 B2
(45) Date of Patent: Oct. 31, 2017

(54) BONDING FILM FOR SIGNAL COMMUNICATION BETWEEN CENTRAL CHIP AND PERIPHERAL CHIPS AND FABRICATING METHOD THEREOF

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/016,336

(22) Filed: Feb. 5, 2016

(65) Prior Publication Data

US 2017/0229409 A1     Aug. 10, 2017

(51) Int. Cl.
*H01L 23/48* (2006.01)
*H01L 23/52* (2006.01)
*H01L 29/40* (2006.01)
*H01L 23/00* (2006.01)
*H01L 25/065* (2006.01)

(52) U.S. Cl.
CPC .............. *H01L 24/08* (2013.01); *H01L 24/03* (2013.01); *H01L 24/25* (2013.01); *H01L 25/0655* (2013.01); *H01L 25/0657* (2013.01); *H01L 2224/023* (2013.01)

(58) Field of Classification Search
CPC ..... H01L 24/08; H01L 24/03; H01L 25/0657; H01L 2224/023
See application file for complete search history.

(56) References Cited

U.S. PATENT DOCUMENTS

| | | | |
|---|---|---|---|
| 8,946,900 B2 | 2/2015 | Qian et al. | |
| 9,543,249 B1* | 1/2017 | Hu | ........................ H01L 23/5383 |
| 2005/0205975 A1* | 9/2005 | Kang | ....................... H01L 21/78 |
| | | | 257/678 |
| 2011/0102657 A1* | 5/2011 | Takahashi | ............... H01L 31/18 |
| | | | 348/308 |
| 2011/0161583 A1* | 6/2011 | Youn | ........................ G11C 7/02 |
| | | | 711/115 |
| 2013/0083582 A1* | 4/2013 | Crisp | ................... H01L 25/0655 |
| | | | 365/63 |
| 2015/0216053 A1* | 7/2015 | Sauer | ................... H01L 25/0657 |
| | | | 361/783 |

\* cited by examiner

*Primary Examiner* — Olik Chaudhuri
*Assistant Examiner* — Wilner Jean Baptiste
(74) *Attorney, Agent, or Firm* — JCIPRNET

(57) ABSTRACT

A bonding film has at least a left longitudinal branch, and a lower latitudinal branch; a first bonding area is configured in a first branch, and a second bonding area is configured in a second branch. A plurality of outer top metal pads and a plurality of inner top metal pads are exposed on a top surface within each bonding area. A central chip is configured in a central area of the bonding film and is electrically coupled to the inner top metal pad, and at least two peripheral chips are configured neighboring to the central chip and electrically coupled to the outer top metal pads. Each of the inner top metal pads is electrically coupled to a corresponding outer top metal pad through an embedded circuitry. The central chip communicates with the peripheral chips through the inner top metal pad, embedded circuitry, and outer top metal pad of the bonding film.

13 Claims, 18 Drawing Sheets

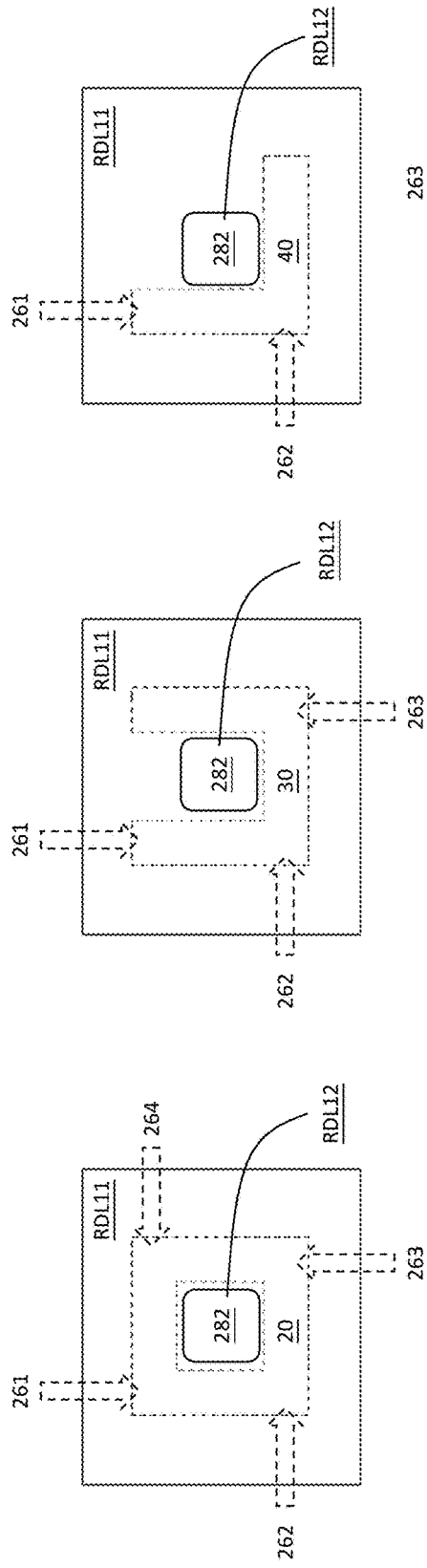

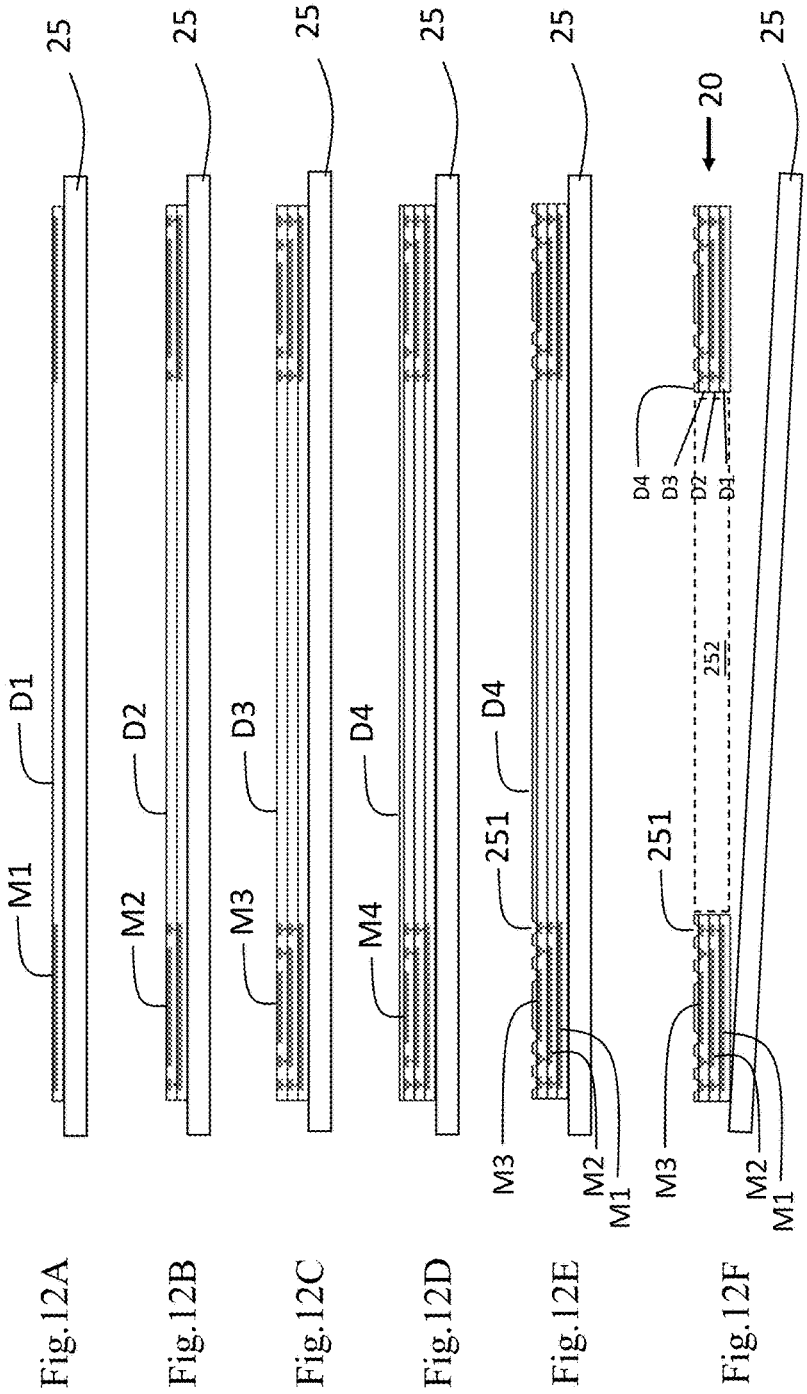

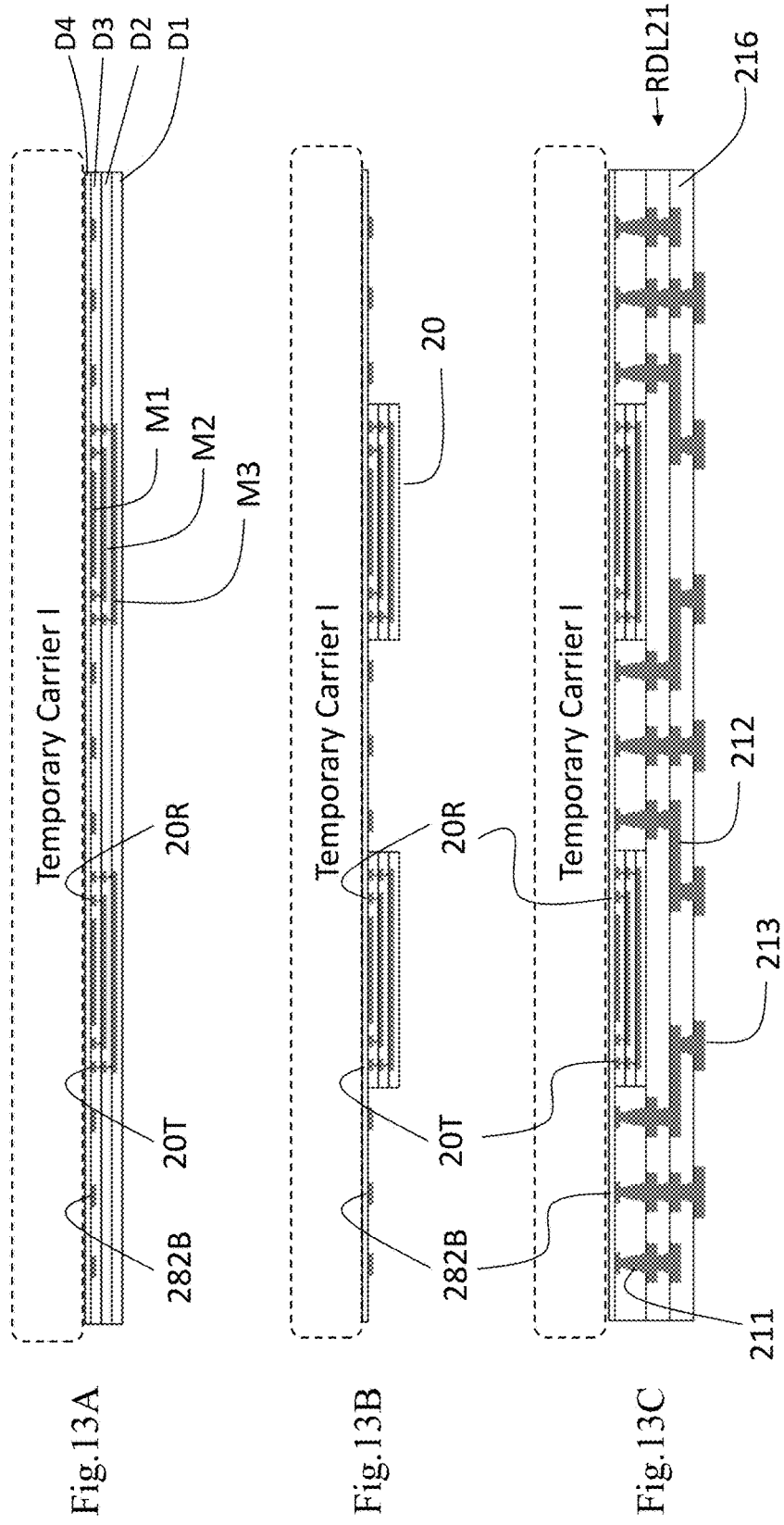

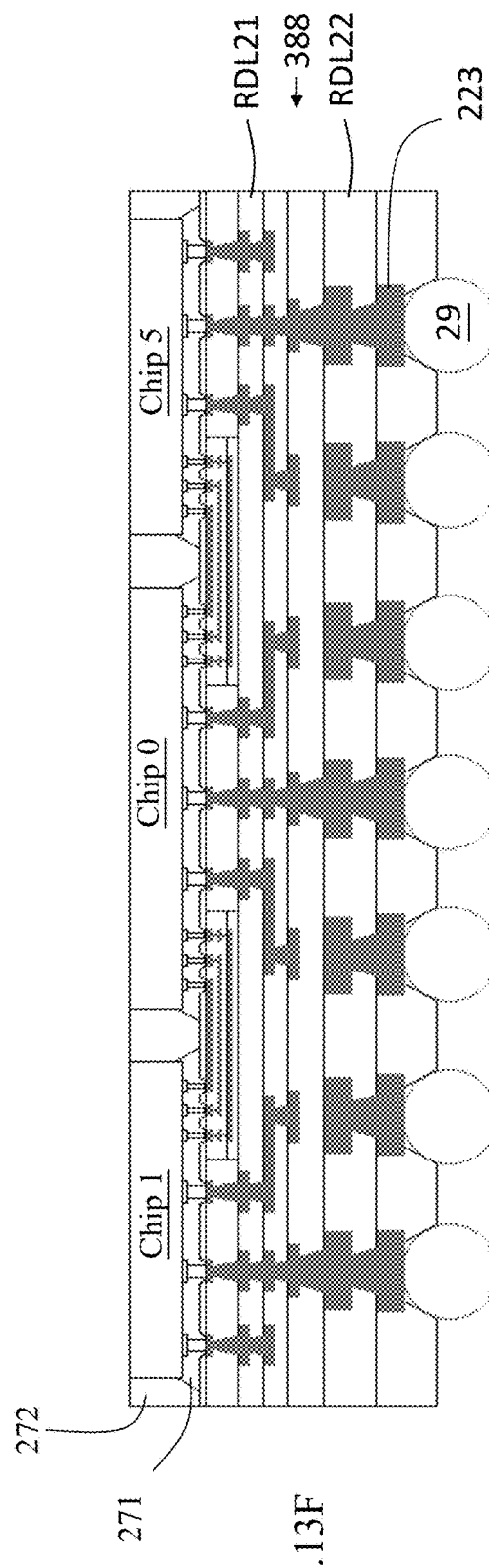

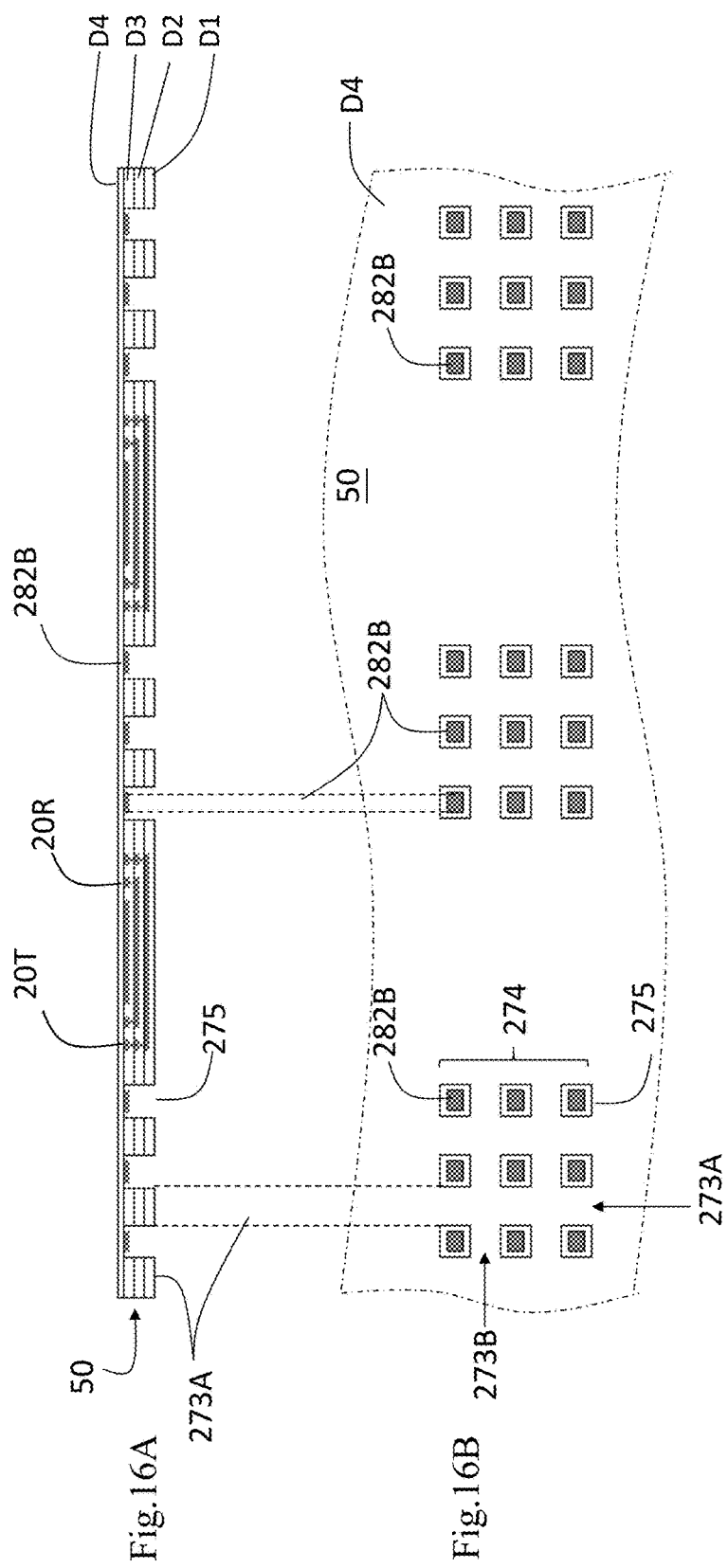

BONDING FILM FOR SIGNAL COMMUNICATION BETWEEN CENTRAL CHIP AND PERIPHERAL CHIPS AND FABRICATING METHOD THEREOF

BACKGROUND

Technical Field

The present invention relates to a bonding film, especially relates to a bonding film for signal communication between a central chip and peripheral chips through a circuitry of the bonding film.

Description of Related Art

FIG. 1 shows a prior art.

FIG. 1 shows that a first chip 11 and a second chip 12 are configured on a top side of an interposer 111. The interposer 111 is configured on a top side of a package substrate 112. The package substrate 112 is configured on a system board 113. For signal communication between the first chip 11 and the second chip 12, a long path needs to go as indicated by the dash line 15. Referring to FIG. 1, the communication path from chip 11 to chip 12 goes from the circuitry of the interposer 111, package substrate 112, system board 113, back to the package substrate 112, the interposer 111, and then reaches chip 12.

The disadvantage for the prior art is that the longer the path it goes, the weaker the signal is received. For a long time, a shorter circuitry for signal communication between neighboring chips is pursued.

BRIEF DESCRIPTION OF THE DRAWINGS

FIGS. 11A~11C show a top view for the three embodiments according to the present invention.

FIGS. 12A~12F show a fabrication process for making a bonding film according to the present invention.

FIGS. 13A~13F show a fabrication process for making a first embedded bonding film according to the present invention.

FIGS. 16A~16B show a bottom view of FIG. 15B.

DETAILED DESCRIPTION OF THE INVENTION

A bonding film having at least two bonding areas therein for signal communication between neighboring chips is disclosed. A first bonding area located in a first branch of the branches of the bonding film, a second bonding area located in a second branch of the branches of the bonding film, a central chip (e.g. CPU) is able to electrically couple to peripheral chips (e.g. memory chip) through a circuitry of the bonding film. The communication circuitry of the bonding film according to the present invention has a shorter path than that of the traditional communication path in a multi-chip package.

Figure 1:
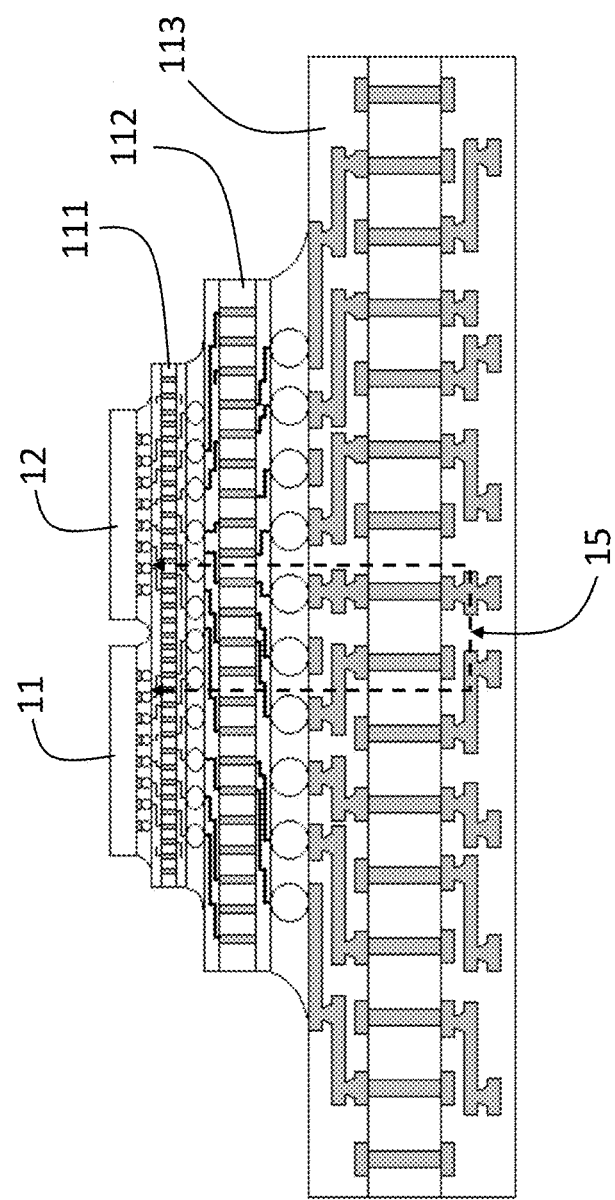
FIG. 1 shows a prior art.
Figure 2:
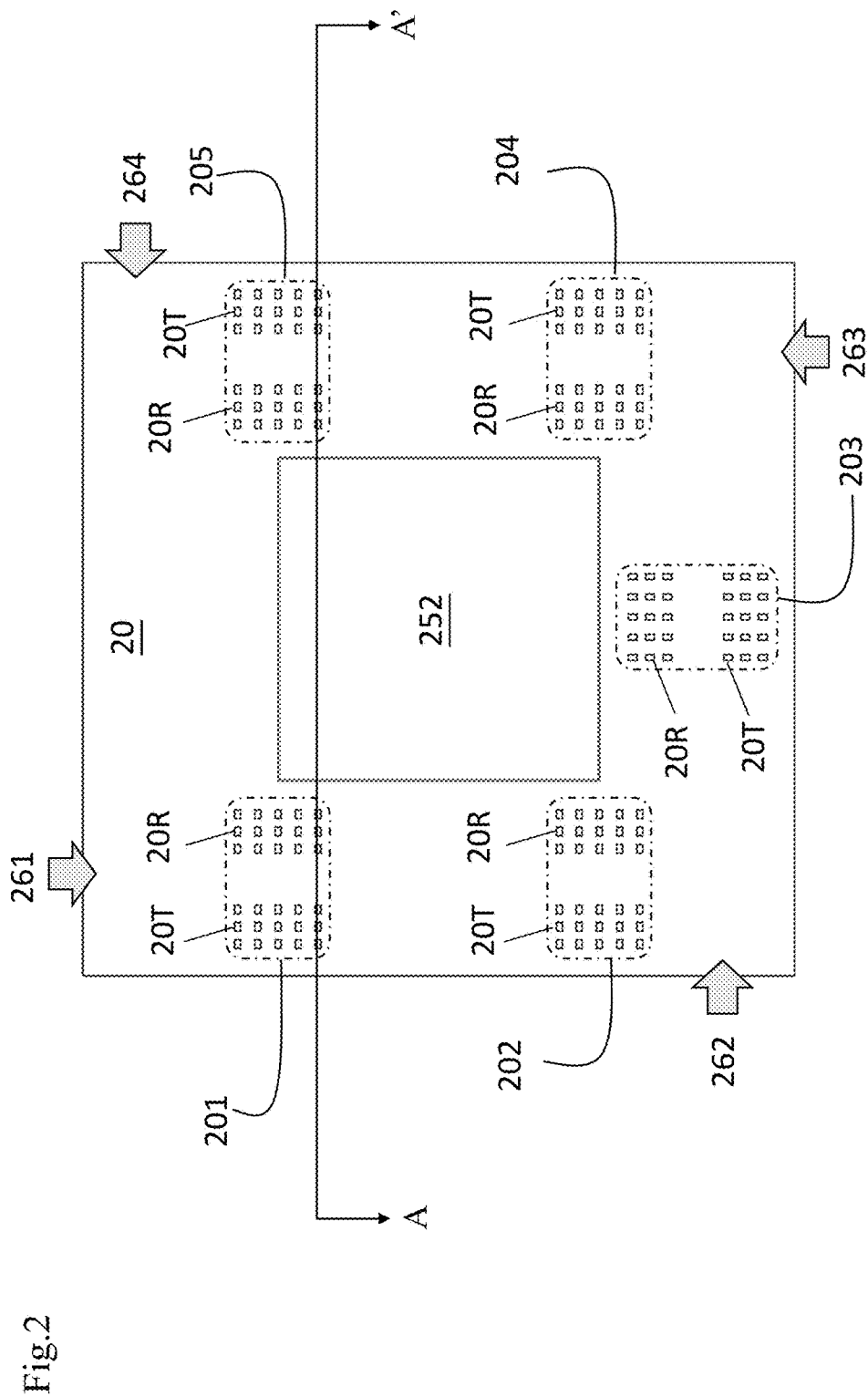
FIG. 2 shows a first embodiment according to the present invention.

FIG. 2 shows a first embodiment according to the present invention.

FIG. 2 shows that a bonding film 20 comprises a left longitudinal branch 261, a lower latitudinal branch 262, a right longitudinal branch 263, and an upper latitudinal branch 264. The left longitudinal branch 261 has a lower end connected with a left end of the lower latitudinal branch 262. The right longitudinal branch 263 has a lower end connected with a right end of the lower latitudinal branch 262. The upper latitudinal branch 264 has a left end connected with an upper end of the left longitudinal branch 261, and has a right end connected with an upper end of the right longitudinal branch 263.

A first bonding area 201 and a second bonding area 202 are configured in the left longitudinal branch 261. A third bonding area 203 is configured in the lower latitudinal branch 262. A fourth bonding area 204 and a fifth bonding area 205 are configured in the right longitudinal branch 263. A plurality of outer top metal pads 20T and a plurality of inner top metal pads 20R are exposed on a top surface of the bonding film 20 within each of the bonding areas 201, 202, 203, 204, 205.

A first and a second metal circuitry (FIG. 3A) are embedded in the left longitudinal branch 261 within the first and second bonding area 201, 202 respectively. A third metal circuitry (not shown) is embedded in the lower latitudinal branch 262 within the third bonding area 203. A fourth and fifth metal circuitry (not shown) are embedded in the right longitudinal branch 263 within the fourth and fifth bonding area (FIG. 3A) 204, 205 respectively.

Figures 3A, 3B:
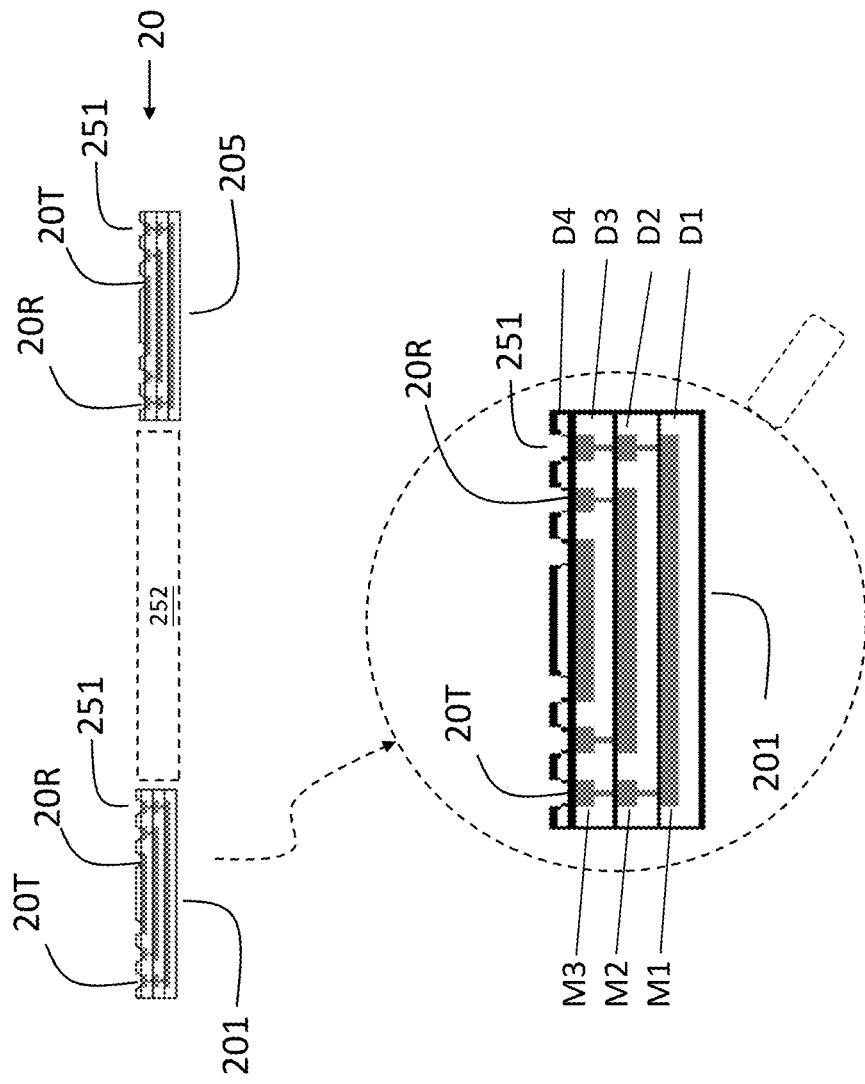
FIGS. 3A~3B show a section view of FIG. 2 according to the present invention.

FIGS. 3A~3B show a section view of FIG. 2 according to the present invention.

FIG. 3A shows a section view according to line AA' of FIG. 2. A plurality of first metal circuits M1, M2, M3 are embedded in the left longitudinal branch 261 within the first bonding area 201; each of the first metal circuits M1, M2, M3 has a left end electrically coupled to one of the outer top metal pads 20T, and each of the first metal circuits has a right end electrically coupled to one of the inner top metal pads 20R. A plurality of second, third, and fourth metal circuits are not shown in FIG. 3A. A plurality of fifth metal circuits M1, M2, M3, are embedded in the right longitudinal branch 263 within the fifth bonding area 205; each of the fifth metal circuits M1, M2, M3 has a left end electrically coupled to one of the outer top metal pads 20T, and each of the fifth metal circuits has a right end electrically coupled to one of the inner top metal pads 20R. A central opening 252 is configured in a central area of the bonding film 20. A plurality of top openings 251 are formed in the dielectric layer D4 to expose the outer top metal pads 20T and the inner top metal pads 20R.

FIG. 3B shows an enlarged view of the first bonding area 201 of the FIG. 3A. A plurality of dielectric layers D1, D2, D3, D4 and a plurality of metal circuits M1, M2, M3 are formed alternatively and sequentially to form the bonding film 20 according to semiconductor process. Four dielectric layers D1, D2, D3, D4 and three metal circuits M1, M2, M3 are shown as an example. More or less layers can be designed in according to a specific design choice. A plurality of top openings 251 are formed in the dielectric layer D4 to expose the outer top metal pads 20T and the inner top metal pads 20R. Both the outer top metal pads 20T and the inner top metal pads 20R are small pads.

Figure 4:
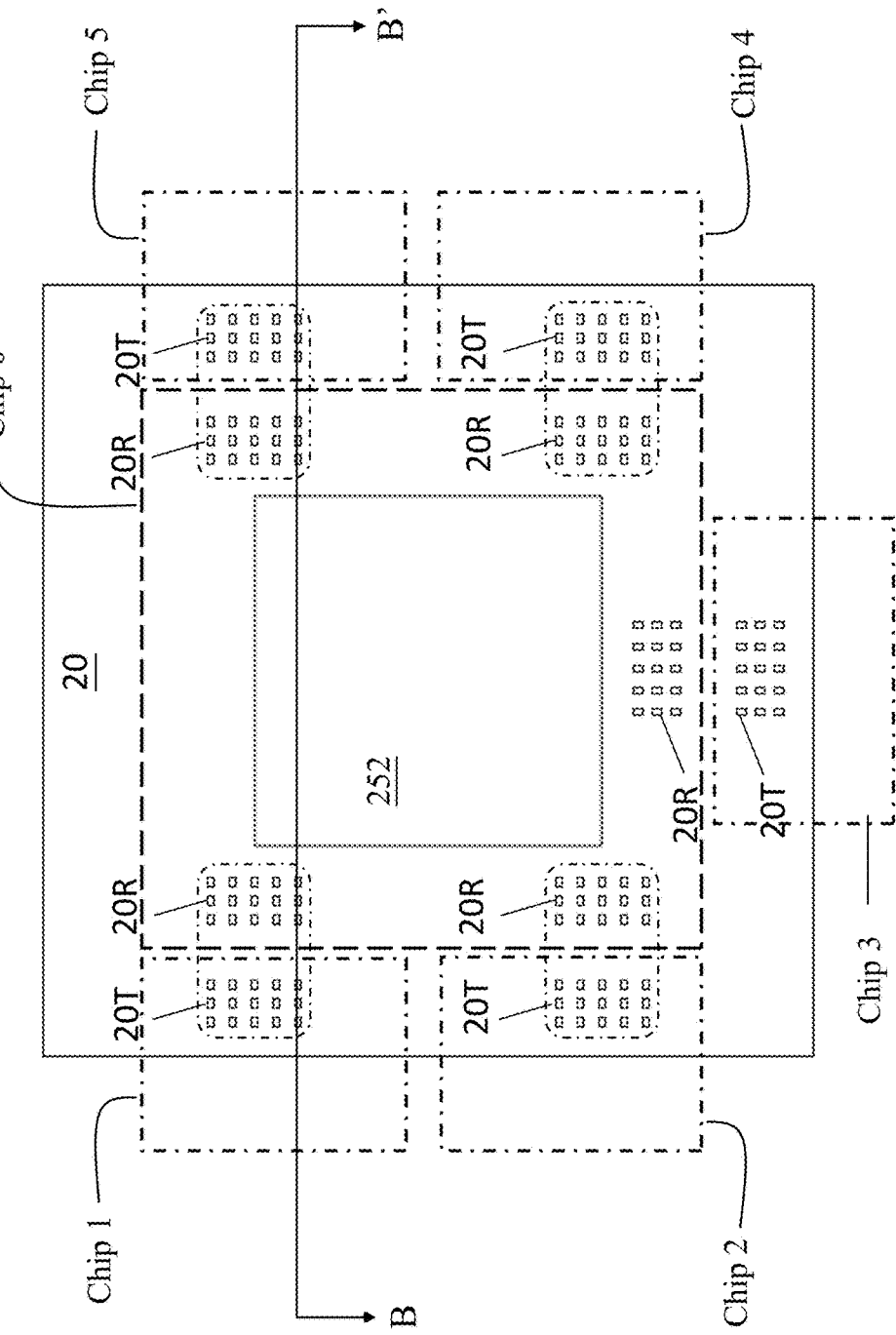
FIG. 4 shows an application of the first embodiment according to the present invention.

FIG. 4 shows an application of the first embodiment according to the present invention.

FIG. 4 shows that a central chip 0 is configured on a top center of the bonding film 20. A chip 1 and a chip 2 are configured on a left side of the central chip 0, a chip 3 is configured on a lower side of the central chip 0; chip 4 and chip 5 are configured on a right side of the central chip 0.

Figure 5:
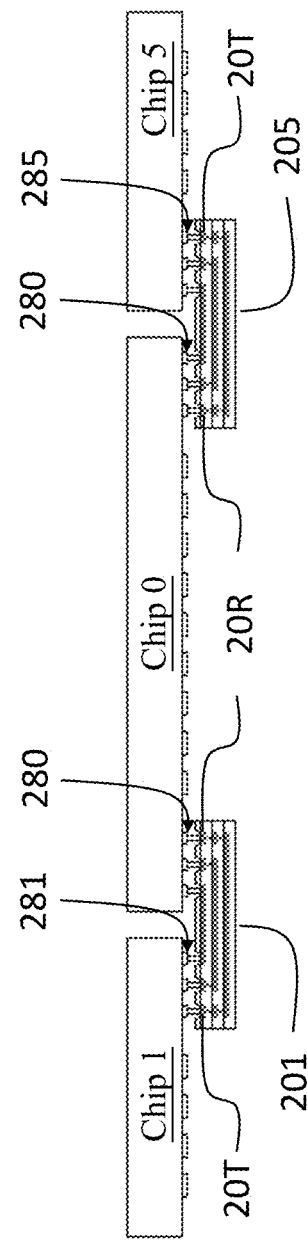
FIG. 5 shows a section view according to line BB' of FIG. 4.

FIG. 5 shows a section view according to line BB' of FIG. 4.

FIG. 5 shows that the central chip 0 has a plurality of bonding elements 280 configured on bottom side and adapted to electrically couple to corresponding inner top metal pads 20R. Each of the chip 1 and chip 2 has a plurality of bonding elements 281 configured on bottom side and adapted to electrically couple to corresponding outer top metal pads 20T. Similarly, chip3, chip 4 and chip 5 (not shown in FIG. 5), each has bonding elements on bottom side to electrically couple to corresponding outer top metal pads 20T.

Figure 6:
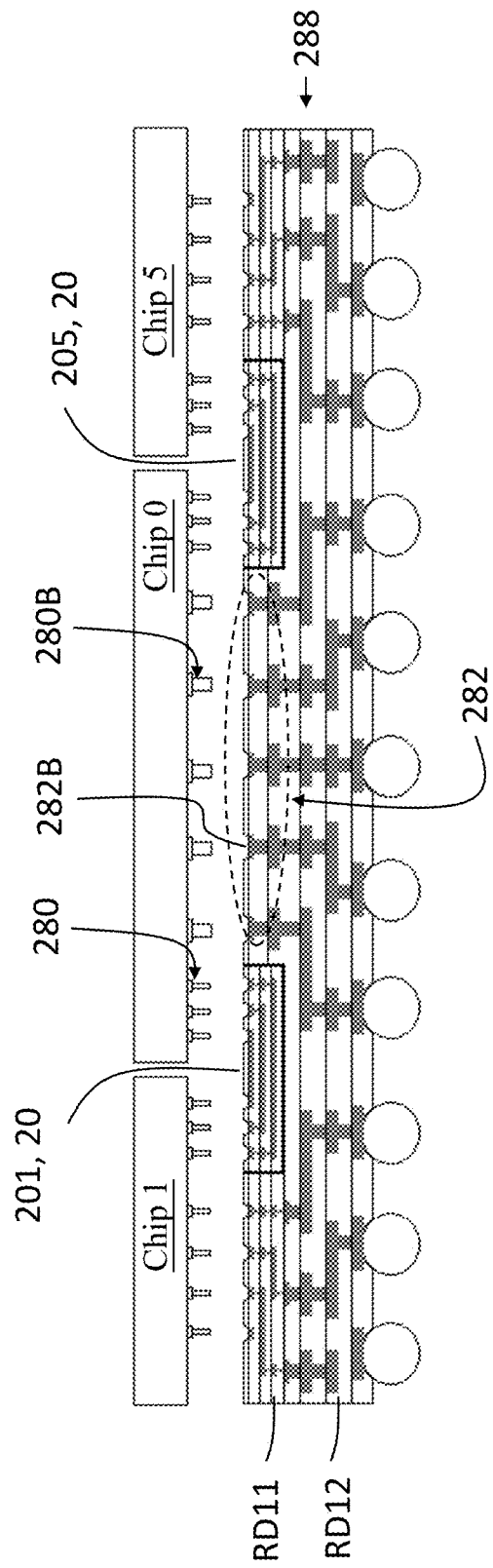
FIG. 6 shows a first embedded bonding film according to the present invention.

FIG. 6 shows a first embedded bonding film according to the present invention.

FIG. 6 shows that a bonding film 20 is embedded in a redistribution substrate 288 which comprises a top redistribution layer RDL11 and a bottom redistribution layer RDL12. The top redistribution layer RDL11 wraps around an outer periphery of the bonding film 20. The bottom redistribution layer RDL12 is configured on a bottom side of the top redistribution layer RDL11.

The top redistribution layer RDL11 is fabricated according to semiconductor process with a circuit design rule similar to that of the bonding film 20. The bottom redistribution layer RDL12 is fabricated according to printed circuit board (PCB) lamination process. The bottom redistribution layer RDL 12 has metal circuit at least ten times thicker than that of the top redistribution layer RDL11.

The bottom redistribution layer RDL12 has a central portion 282 configured within the central opening 252 (FIG. 4) of the bonding film 20. The central portion 282 has a plurality of large metal pads 282B exposed on top side and aligned with the bonding elements 280B in central bottom of the central chip 0 so that the thick bonding elements 280B are able to electrically couple to corresponding large metal pads 282B of the central portion 282. Each of the large metal pads 282B has a surface area at least two times than that of the small pads 20T, 20R. The thick bonding elements 280B can be one of power pins, and the large metal pad 282B can be one of power pads.

Referring to the central chip 0, a second plurality of thick bonding elements 280B (power pins) are configured on a central bottom of the central chip 0. Each of the thick bonding elements 280B is thicker than each of the first plurality of bonding elements 280 (signal pins) configured on a bottom periphery of the central chip 0. The thick bonding elements 280B are designed for large current connection such as power connection elements.

Figure 7:
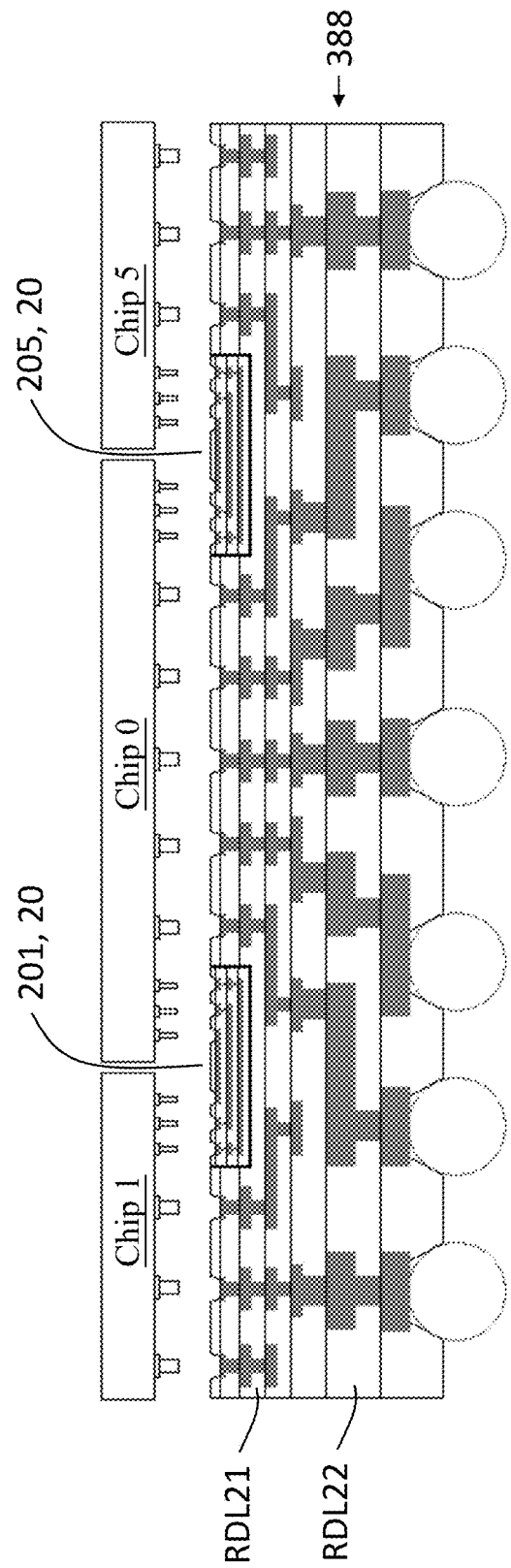
FIG. 7 shows a second embedded bonding film according to the present invention.

FIG. 7 shows a second embedded bonding film according to the present invention.

FIG. 7 shows the bonding film 20 is embedded in a redistribution substrate 388 which comprises a top redistribution layer RDL21 and a bottom redistribution layer RDL22. The top redistribution layer RDL21 is fabricated according to printed circuit board (PCB) lamination process. The top redistribution layer RDL21 has metal circuits with a thickness at least ten times thicker than that of the bonding film 20. The bottom redistribution layer RDL22 is fabricated according to printed circuit board (PCB) lamination process. The bottom redistribution layer RDL22 has metal circuits with a thickness at least ten times thicker than that of the top redistribution layer RDL21.

FIG. 7 shows that a thickness of each circuit of the top redistribution layer RDL21 is at least ten times thicker than that of the bonding film 20, and a thickness of each circuit of the bottom redistribution layer RDL22 is at least ten times thicker than that of the top redistribution layer RDL21. The figures are not drawn to scale.

Figure 8:
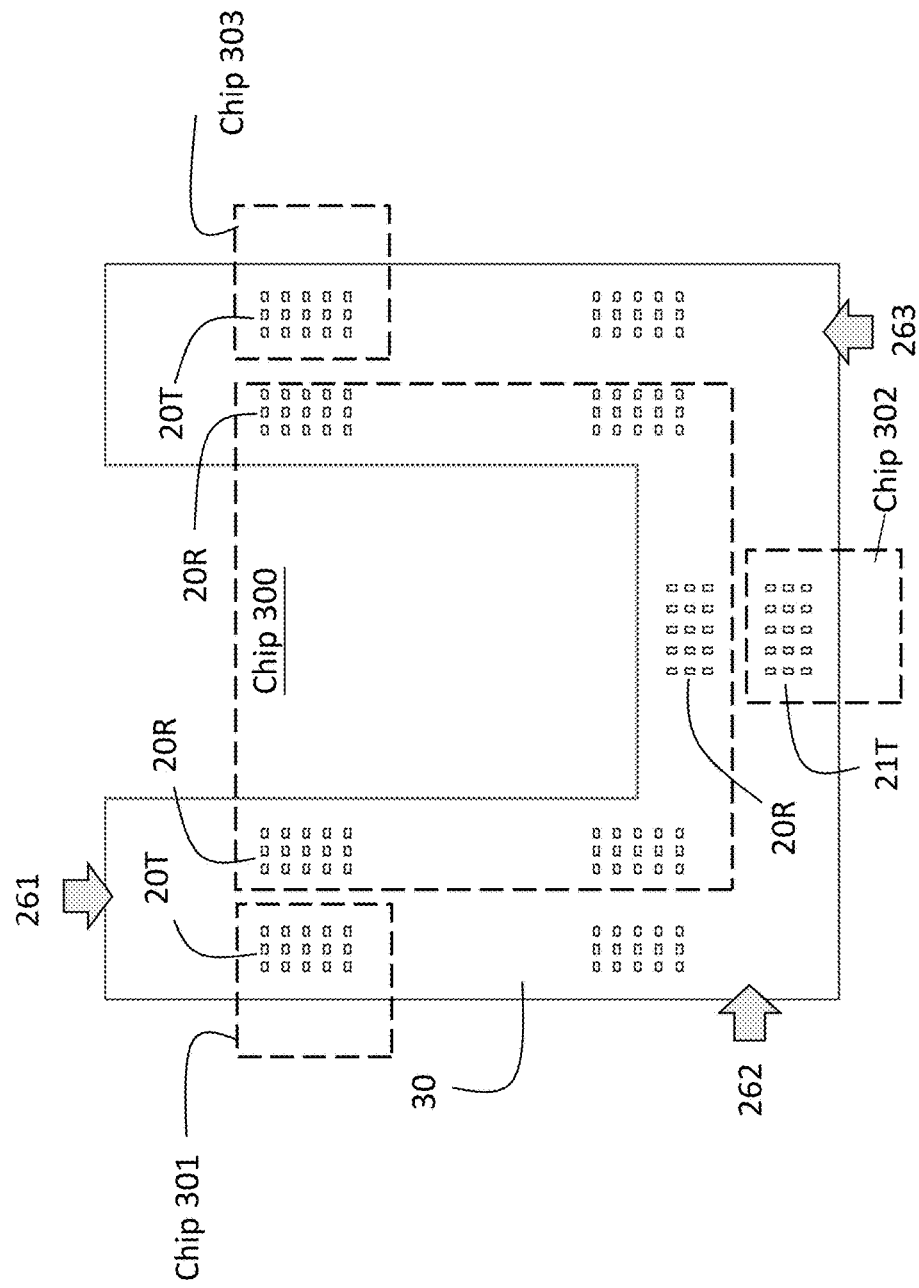
FIG. 8 shows a second embodiment according to the present invention.

FIG. 8 shows a second embodiment according to the present invention.

FIG. 8 shows that a U shaped bonding film 30 is formed with a left longitudinal branch 261, a lower latitudinal branch 262, and a right longitudinal branch 263. The U shaped bonding film 30 has a plurality of outer bonding pads 20T and a plurality of inner bonding pads 20R exposed on top side of the U shaped bonding film 30. The three branches 261, 262, 263 forms a U shaped bonding film 30. The U shaped bonding film 30 provides left side, lower side, and right side accommodation for at least three chips 301, 302, 303 each configured on one of the three sides, so that a central chip 300 is able to electrically couple to the peripheral chips 301, 302, 303 through the outer bond pads 20T and the inner bond pads 20R of the U shaped bonding film 30.

Figure 9:
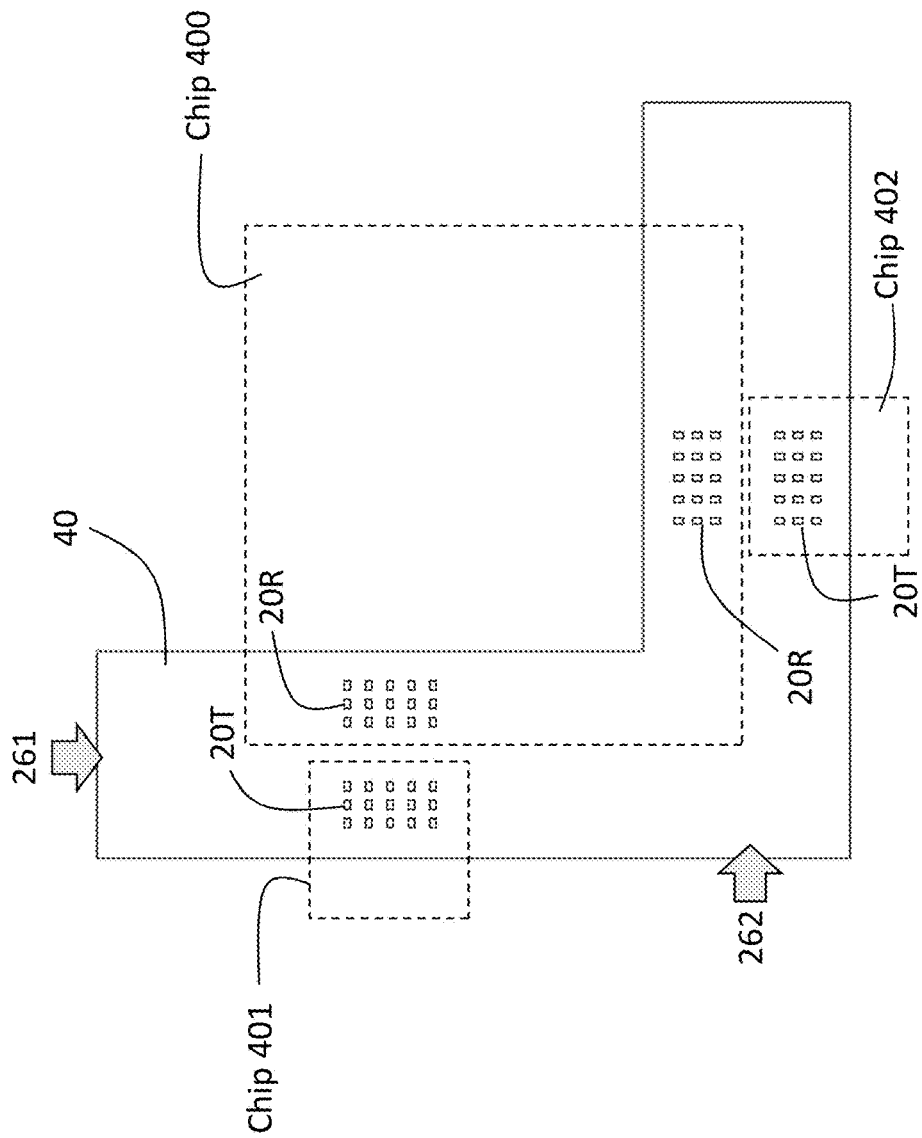
FIG. 9 shows a third embodiment according to the present invention.

FIG. 9 shows a third embodiment according to the present invention.

FIG. 9 shows that an L shaped bonding film 40 is formed with a left longitudinal branch 261, and a lower latitudinal branch 262. The L shaped bonding film 40 has a plurality of outer bonding pads 20T and a plurality of inner bonding pads 20R exposed on top side of the L shaped bonding film 40. The two branches 261, 262, forms an L shaped bonding film 40. The L shaped bonding film 40 provides left side, and lower side accommodation for chips 401, 402, each on one side of the two sides, so that a central chip 400 is able to electrically couple to the peripheral chips 401, 402 through the inner bonding pads 20R and the outer bonding pads 20T of the L shaped bonding film 40.

Figure 10:
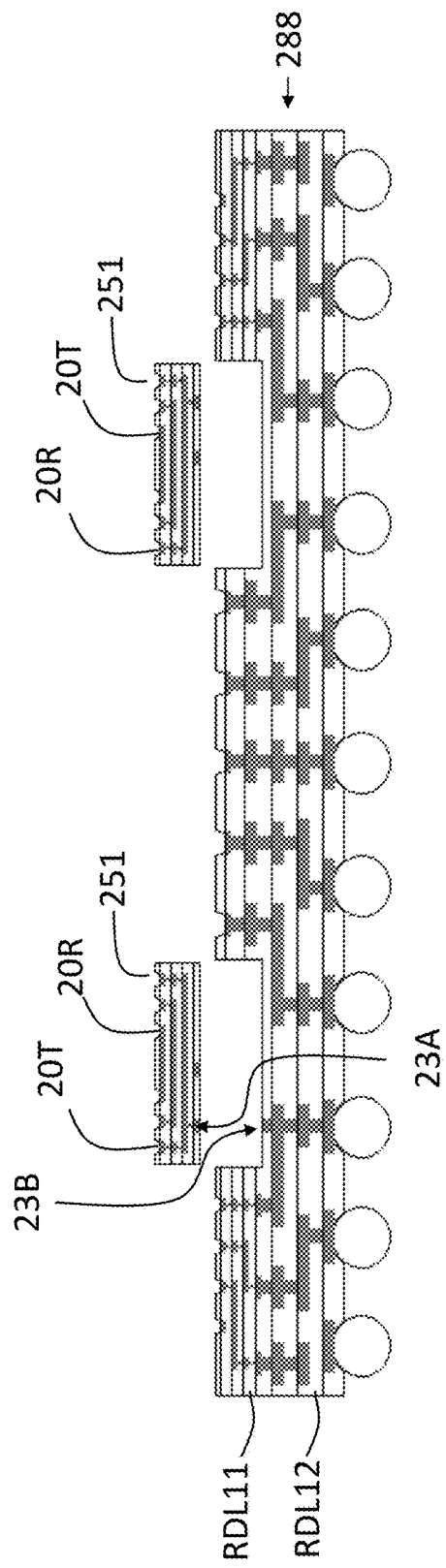
FIG. 10 shows a fourth embodiment according to the present invention.

FIG. 10 shows a fourth embodiment according to the present invention.

FIG. 10 shows that the bonding film 20 further comprises bottom contact 23A which is able to electrically couple to a top metal contact 23B of the redistribution circuitry of the redistribution layer RDL12 on bottom when the bonding film 20 is embedded in the redistribution substrate.

FIGS. 11A~11C show a top view for the three embodiments according to the present invention.

FIG. 11A shows that the central portion 282 of the redistribution layer RDL12 is configured in the central opening of the bonding film 20. The top redistribution layer RDL11 wraps around an outer periphery of the bonding film 20.

FIG. 11B shows that the central portion 282 of the redistribution layer RDL12 is configured in the central opening of the U shaped bonding film 30. The top redistribution layer RDL11 wraps around an outer periphery of the U shaped bonding film 30.

FIG. 11C shows that the central portion 282 of the redistribution layer RDL12 is configured in the central opening of the L shaped bonding film 40. The top redistribution layer RDL11 wraps around an outer periphery of the L shaped bonding film 40.

FIGS. 12A~12F show a fabrication process for making a bonding film according to the present invention.

A fabrication process for making a bonding film, in a section view, comprises:

FIG. 12A shows: preparing a temporary carrier 25; and forming a first dielectric layer D1 and a first metal circuitry M1 on top surface of the temporary carrier 25;

FIG. 12B shows: forming a second dielectric layer D2 and a second metal circuitry M2 on a top surface of the first dielectric layer D1 and the first metal circuitry M1;

FIG. 12C shows: forming a third dielectric layer D3 and a third metal circuitry M3 on a top surface of the second dielectric layer D2 and the second metal circuitry M2;

FIG. 12D shows: forming a fourth dielectric layer D4 and a fourth metal circuitry M4 on a top surface of the third dielectric layer D3 and the third metal circuitry M3;

FIG. 12D shows: etching to form opening 251 in the dielectric layer D4 to expose a plurality of outer top metal pads 20T on top and to expose a plurality of inner top metal pads 20R on top;

FIG. 12E shows: etching to form a bonding film 20, wherein the bonding film 20 has a left longitudinal branch 261, a lower latitudinal branch 262, a right longitudinal branch 263, and an upper latitudinal branch 264; wherein at least two bonding areas 201, (202, 203, 204,) 205 are configured in the bonding film 20; wherein a first bonding area is configured in one of the two longitudinal branches 261, 263 and the other one is configured in one of the other three branches; and wherein each of the two bonding areas 201, (202, 203, 204,) 205 has a plurality of outer top metal pads 20T exposed on a top surface of the bonding film 20, and a plurality of inner top metal pads 20R exposed on the top surface of the bonding film 20; each of the bonding area 201, (202, 203, 204,) 205 has a plurality of metal circuits M1, M2, M3 embedded in the bonding film 20, and each of the metal circuits M1, M2, M3 has a left end electrically coupled to one of the outer top metal pads 20T, and each of the metal circuits M1, M2, M3 has a right end electrically coupled to one of the inner top metal pads 20R.

FIGS. 13A~13F show a fabrication process for making a first embedded bonding film according to the present invention.

For FIGS. 13A~13G, for easier understanding, the products or semi-products are kept in a normal position, i.e. chip side upwards, and therefore temporary carrier is configured on top side although it should be on a bottom side in actual process.

FIG. 13A shows: forming a plurality of dielectric layers D1~D4 and metal circuit layers M1, M2, M3 sequentially on bottom of a temporary carrier I through semiconductor process. The topmost metal circuit layer M1 includes a plurality of small pads 20T, 20R and a plurality of large metal pads 282B. A material for the dielectric layers D1~D4, D1~D4 for the semiconductor process comprises those typically used in semiconductor back end of line (BOEL) process includes but not limited to silicon dioxide (SiO2), and silicon nitride (Si3N4), polyimide, Bisbenzocyclobutene (BCB), and Silicone.

FIG. 13B shows: etching selectively to leave large metal pads 282B and a structure of bonding film 20.

FIG. 13C shows: forming a first redistribution layer RDL21 through lamination process. RDL21 has a plurality of metal via 211, each metal via 211 is electrically coupled to a corresponding one of the large metal pads 282B. RDL21 has circuitry 212 and a plurality of bottom metal pads 213. Bonding film 20 is embedded in the first redistribution layer RDL21. A material for the dielectric layer 216 in lamination process comprises those common materials used in laminated substrate such as ABF, prepregs, polyimide, BCB, and silicone.

Figures 13D, 13E:
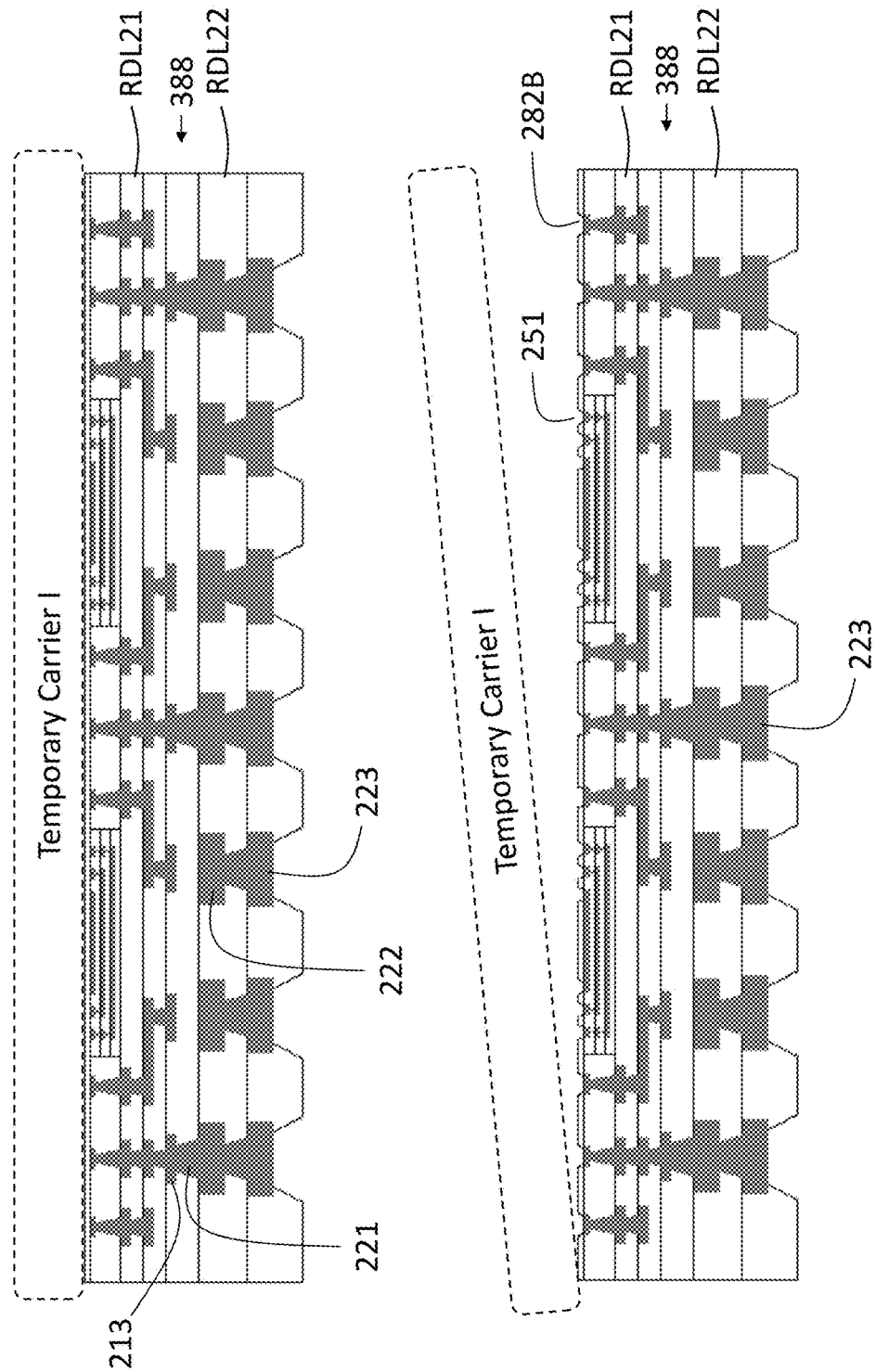

FIG. 13D shows: forming a second redistribution layer RDL22 on a bottom of the RDL21 through lamination process. RDL22 has a plurality of metal via 221, each metal via 221 is electrically coupled to a corresponding one of the metal pads 213. RDL22 has circuitry 222 and a plurality of bottom metal pads 223.

FIG. 13E shows: removing temporary carrier I and forming a plurality of top opening 251. Each top opening 251 exposes a corresponding one of the top metal pads 20T, 20R and large metal pads 282B.

FIG. 13F shows: mounting chip 0, chip 1, and chip 5 on top of the substrate 388, and planting solder ball 29 on bottom of the substrate 388. Underfill 271 is filled in a gap between the chips and the substrate 388. Molding compound 272 is applied to encapsulate the chips.

Figure 14:
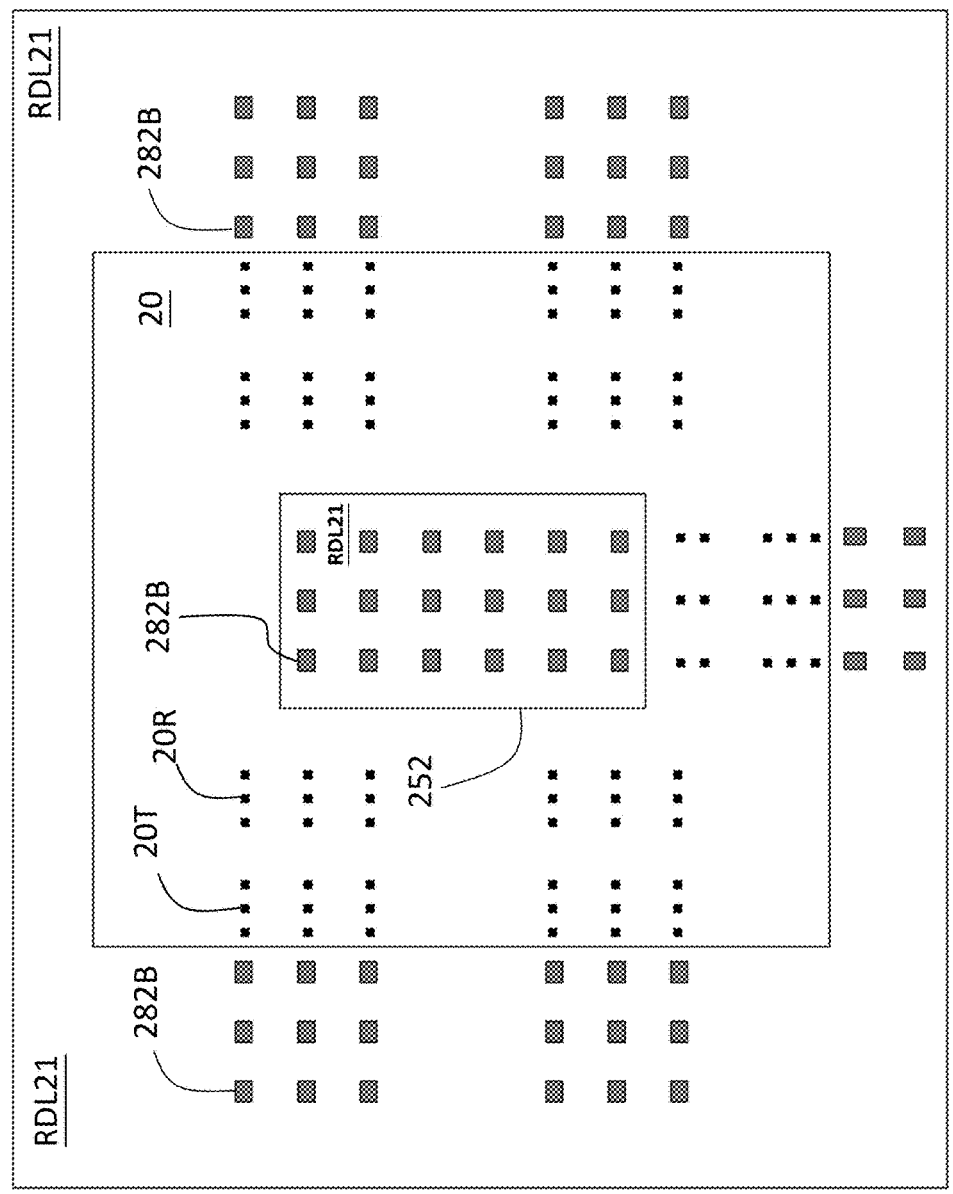
FIG. 14 shows a top view of an embedded bonding film according to the present invention.

FIG. 14 shows a top view of an embedded bonding film according to the present invention.

FIG. 14 shows a top view of a substrate in FIG. 13E or FIG. 13F. FIG. 14 shows a bonding film 20 is embedded in the first redistribution layer RDL21. The first redistribution layer RDL21 is coplanar with the bonding film 20 on top surface. A plurality of large metal pads 282B is configured on top surface of the RDL21. A first plurality of the large metal pads 282B are configured within the central opening 252 of the bonding film 20, and a second plurality of the large metal pads 282B are configured surrounding the bonding film 20.

Figures 15A, 15B, 15C:
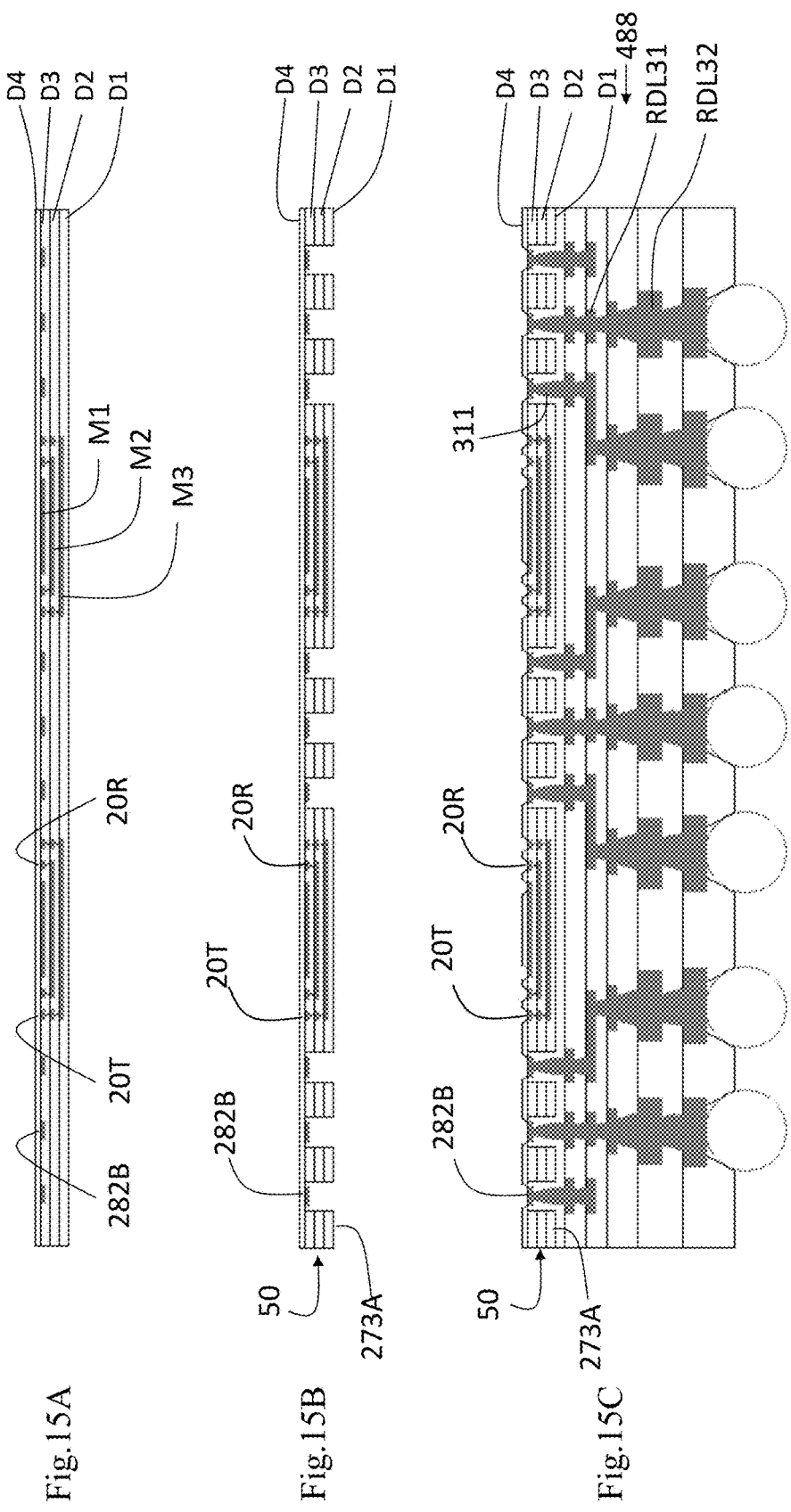
FIGS. 15A~15C show a fabrication process for making a second embedded bonding film according to the present invention.

FIGS. 15A~15C show a fabrication process for making a second embedded bonding film according to the present invention.

A ribbed bonding film 50 embedded in a substrate 488 is fabricated according the this embodiment.

FIG. 15A shows: forming a plurality of dielectric layers D1~D4 and metal circuit layers M1, M2, M3 sequentially. The topmost metal circuit layer M1 includes a plurality of small pads 20T, 20R and a plurality of large metal pads 282B.

FIG. 15B shows: etching selectively to leave large metal pads 282B and a plurality of dielectric ribs 273 to form a ribbed bonding film 50. The dielectric ribs 273 can be fabricated in a form of parallel (FIG. 16B) only or in a form of a mesh (FIG. 16B) to strengthen the stiffness of the bonding film 50.

FIG. 15C shows: forming a first redistribution layer RDL31 through lamination process. RDL31 has a plurality of metal via 311, each metal via 311 is electrically coupled to a corresponding one of the large metal pads 282B. A second redistribution layer RDL32 is formed on a bottom of the RDL31. The top bonding film 50 is buried in the substrate 488. The substrate 488 comprises the first redistribution RDL31 and the second redistribution RDL32.

FIGS. 16A~16B show a bottom view of FIG. 15B.

For easy understanding the structure of FIG. 15B, FIG. 16A is copied from FIG. 15B FIG. 16A is a section view of FIG. 16B. FIG. 16B shows a partial area bottom view of FIG. 16A (FIG. 15B). A plurality of longitudinal dielectric ribs 273A and a plurality of latitudinal dielectric ribs 273B are formed in the bonding film 50 to strengthen the stiffness of the bonding film 50. A dielectric mesh 274 is formed by the longitudinal ribs 273A and the latitudinal ribs 273B with a plurality of mesh holes 275. Each of the large metal pads 282B is configured in a corresponding mesh hole 275.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM chip 1, 2, 3
bonding film 20, 30, 40, 50
redistribution substrate 288
bonding area 201, 202, 203, 204, 205
inner top metal pads 20R
outer top metal pads 20T
Metal via 211, 311
Metal pad 213, 223
dielectric layer 216
bottom contact 23A
metal contact 23B
temporary carrier 25
openings 251
central opening 252
left longitudinal branch 261
lower latitudinal branch 262
right longitudinal branch 263
upper latitudinal branch 264
Underfill 271
Molding compound 272
Dielectric rib 273A, 273B
Dielectric mesh 274
Mesh holes 275
bonding element 280, 281, 285
thick bonding element 280B
central portion 282
large metal pad 282B
substrate 288, 388, 488
Solder ball 29
chip 301, 302, 303
chip 400, 401, 402
dielectric layer D1, D2, D3, D4
metal circuits M1, M2, M3
top redistribution layer RDL11, RDL21, RDL31
bottom redistribution layer RDL12, RDL22, RDL32

What is claimed is:

1. A bonding film, comprising:
a left longitudinal branch and a lower latitudinal branch, wherein a lower end of the left longitudinal branch is connected to a left end of the lower latitudinal branch; and
a plurality of bonding areas including at least a first bonding area and a second bonding area on the left longitudinal branch and the lower latitudinal branch, respectively, wherein the left longitudinal branch and the lower latitudinal branch form an L shape, wherein each bonding area of the plurality of bonding areas comprises:
a plurality of outer top metal pads and a plurality of inner top metal pads on a top surface of the bonding film within the bonding area; and
a plurality of metal circuits embedded in the bonding film within the bonding area, each metal circuit of the plurality of metal circuits having an outer end electrically coupled to a corresponding one of the plurality of outer top metal pads, and an inner end electrically coupled to a corresponding one of the plurality of inner top metal pads.

2. The bonding film as claimed in claim 1, wherein at least one of the first and second bonding areas further comprises:
at least a bottom metal pad exposed on a bottom surface of the bonding film within the bonding area, wherein the bottom metal pad is electrically coupled to a corresponding one of the plurality of metal circuits of the bonding area.

3. The bonding film as claimed in claim 1, further comprising:
a plurality of first dielectric ribs extending parallel to each other to strengthen a stiffness of the bonding film.

4. The bonding film as claimed in claim 3, further comprising:
a plurality of large metal pads, wherein each large metal pad of the plurality of large metal pads is configured between neighboring first dielectric ribs among the plurality of first dielectric ribs, and has a surface area at least two times larger than that of each top metal pad among the plurality of outer top metal pads and the plurality of inner top metal pads.

5. The bonding film as claimed in claim 3, further comprising:
a plurality of second dielectric ribs extending parallel to each other and perpendicular to the plurality of first dielectric ribs to further strengthen the stiffness of the bonding film; and
a plurality of large metal pads, wherein a dielectric mesh with a plurality of mesh holes is formed by the plurality of first dielectric ribs and the plurality of second dielectric ribs, and each large metal pad of the plurality of large metal pads is configured in a corresponding mesh hole among the plurality of mesh holes, and has a surface area at least two times larger than that of each top metal pad among the plurality of outer top metal pads and the plurality of inner top metal pads.

6. The bonding film as claimed in claim 1, further comprising:
a central chip over a central area of the bonding film and over a part of each of the first and second bonding areas, the central chip having, on a bottom surface thereof, bonding elements electrically coupled to the plurality of inner top metal pads of the first and second bonding area;
a first peripheral chip at a first side of the central chip and over a further part of the first bonding area, the first peripheral chip having, on a bottom surface thereof, bonding elements electrically coupled to the plurality of outer top metal pads of the first bonding area; and
a second peripheral chip at a second side of the central chip and over a further part of the second bonding area, the second peripheral chip having, on a bottom surface thereof, bonding elements electrically coupled to the plurality of outer top metal pads of the second bonding area, wherein the central chip communicates with the first and second peripheral chips through the plurality of inner top metal pads, the plurality of embedded metal circuits, and the plurality of outer top metal pads of the first and second bonding areas, respectively.

7. The bonding film as claimed in claim 6, further comprising:
a plurality of large metal pads arranged outside the first and second bonding areas, wherein each large metal pad of the plurality of large metal pads has a surface area at least two times larger than that of each top metal pad among the plurality of outer top metal pads and the plurality of inner top metal pads, and wherein the central chip further has a plurality of thick bonding elements on the bottom surface thereof, each thick bonding element of the plurality of thick bonding elements is thicker than each of the bonding elements of the central chip and electrically coupled to a corresponding large metal pad among the plurality of large metal pads.

8. The bonding film as claimed in claim 1, wherein:
the bonding film is embedded in a redistribution substrate, and the redistribution substrate has a central portion in a central opening of the bonding film, and a plurality of large metal pads exposed on a top surface of the central portion of the redistribution layer, wherein each large metal pad of the plurality of large metal pads has a surface area at least two times larger than that of each top metal pad among the plurality of outer top metal pads and the plurality of inner top metal pads.

9. The bonding film as claimed in claim 8, wherein the redistribution layer comprises a top redistribution layer extending around the bonding film, and having the plurality of large metal pads, and a bottom redistribution layer on a bottom of the top redistribution layer, and the bottom redistribution layer has metal circuits thicker than metal circuits of the top redistribution layer.

10. The bonding film as claimed in claim 9, wherein the metal circuits of the bottom redistribution layer are at least ten times thicker than the metal circuits of the top redistribution layer.

11. The bonding film as claimed in claim 10, wherein the metal circuits of the top redistribution layer are at least ten times thicker than the plurality of metal circuits of the plurality of binding areas.

12. The bonding film as claimed in claim 1, further comprising:
a right longitudinal branch having a lower end connected to a right end of the lower latitudinal branch, wherein the left and right longitudinal branches and the lower latitudinal branch form a U shape, and the plurality of bonding areas further includes a third bonding area on the right longitudinal branch.

13. The bonding film as claimed in claim 12, further comprising:
an upper latitudinal branch having a left end connected to a top end of the left longitudinal branch, and a right end connected to a top end of the right longitudinal branch, wherein the left and right longitudinal branches and the lower and upper latitudinal branches form a right shape and surround a central opening of the bonding film, and the plurality of bonding areas further includes a fourth bonding area on the upper latitudinal branch.

* * * * *